(12) United States Patent
Meng et al.

(10) Patent No.: US 12,080,731 B2
(45) Date of Patent: Sep. 3, 2024

(54) LIGHT DETECTION SUBSTRATE, MANUFACTURING METHOD THEREOF AND LIGHT DETECTION APPARATUS

(71) Applicant: BOE TECHNOLOGY GROUP CO., LTD., Beijing (CN)

(72) Inventors: Fanli Meng, Beijing (CN); Jiangbo Chen, Beijing (CN); Fan Li, Beijing (CN); Kui Liang, Beijing (CN); Da Li, Beijing (CN); Shuo Zhang, Beijing (CN); Zeyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 295 days.

(21) Appl. No.: 17/630,651

(22) PCT Filed: Mar. 12, 2021

(86) PCT No.: PCT/CN2021/080521
§ 371 (c)(1),
(2) Date: Jan. 27, 2022

(87) PCT Pub. No.: WO2021/180214
PCT Pub. Date: Sep. 16, 2021

(65) Prior Publication Data
US 2022/0262834 A1    Aug. 18, 2022

(30) Foreign Application Priority Data
Mar. 13, 2020    (CN) ......................... 202010176046.4

(51) Int. Cl.
*H01L 27/146*    (2006.01)
*H04N 25/778*    (2023.01)
*H01L 31/108*    (2006.01)

(52) U.S. Cl.
CPC .. *H01L 27/14607* (2013.01); *H01L 27/14692* (2013.01); *H01L 27/14698* (2013.01);
(Continued)

(58) Field of Classification Search
CPC ......... H01L 27/14607; H01L 27/14692; H01L 27/14698; H01L 27/14616; H01L 31/1085;
(Continued)

(56) References Cited

U.S. PATENT DOCUMENTS

2009/0146178 A1    6/2009    Miyachi et al.
2016/0013328 A1*   1/2016    Tashiro ............... H01L 31/0232
                                                                250/214 A
(Continued)

FOREIGN PATENT DOCUMENTS

CN    107170842 A    9/2017
CN    108878544 A    11/2018
(Continued)

*Primary Examiner* — Bitew A Dinke
(74) *Attorney, Agent, or Firm* — HOUTTEMAN LAW LLC (57) ABSTRACT

The disclosure provides a light detection substrate, a manufacturing method thereof and a light detection apparatus. The light detection substrate includes a plurality of light detection units, each of the light detection units includes a first electrode, a second electrode and a photoelectric conversion layer, a spacer region exists between orthographic projections of the first electrode and the second electrode on a substrate, the photoelectric conversion layer is provided with at least one opening, and an orthographic projection of the at least one opening on the substrate is located in the spacer region.

19 Claims, 5 Drawing Sheets

(52) U.S. Cl.
CPC ..... *H04N 25/778* (2023.01); *H01L 27/14616* (2013.01); *H01L 31/1085* (2013.01)

(58) Field of Classification Search
CPC ......... H01L 27/14658; H01L 27/14643; H01L 27/14683; H04N 25/778
See application file for complete search history.

(56) References Cited

U.S. PATENT DOCUMENTS

| | | | |
|---|---|---|---|
| 2018/0342558 A1* | 11/2018 | Hirata | ................... H10K 19/20 |
| 2020/0020736 A1* | 1/2020 | Liang | ................ H01L 27/14614 |
| 2020/0374475 A1* | 11/2020 | Fukuoka | ................ H10K 19/20 |
| 2021/0193739 A1* | 6/2021 | Ogasahara | ........ H01L 27/14647 |
| 2021/0233954 A1* | 7/2021 | Hua | ...................... G01T 1/2018 |
| 2021/0257414 A1* | 8/2021 | Takada | ................... H10K 39/32 |

FOREIGN PATENT DOCUMENTS

| | | | | | |
|---|---|---|---|---|---|
| CN | 109830563 A | * | 5/2019 | ........... | G01T 1/2018 |
| CN | 110752268 A | | 2/2020 | | |
| CN | 111354756 A | | 6/2020 | | |
| JP | 2009283544 A | * | 12/2009 | | |
| WO | WO-2012035702 A1 | * | 3/2012 | ....... | H01L 27/14603 |

\* cited by examiner

LIGHT DETECTION SUBSTRATE, MANUFACTURING METHOD THEREOF AND LIGHT DETECTION APPARATUS

CROSS-REFERENCE TO RELATED APPLICATIONS

The present application claims the priority of the Chinese Patent Application No. 202010176046.4 filed at the Chinese Intellectual Property Office on Mar. 13, 2020, the content of which is incorporated herein by reference in its entirety.

TECHNICAL FIELD

The present disclosure relates to technical field of photoelectric sensors, and particularly relates to a light detection substrate, a manufacturing method thereof and a light detection apparatus.

BACKGROUND

At present, Metal-Semiconductor-Metal (MSM) light detection structure has advantages of high response speed, small capacitance, simple process, easy integration and the like, and is therefore widely applied to the field of semiconductor detection. Metal-Semiconductor-Metal light detection structure may be integrated with various TFT (Thin Film Transistor) backplanes, forming an X-ray flat panel detector.

A semiconductor in an MSM light detector is usually hydrogenated amorphous silicon a-Si:H. An active layer of a TFT for outputting an electric signal in a TFT backplane is usually made of amorphous silicon, but the mobility of the active layer is low and is only 0.5 to 1 $cm^2/(V \cdot s)$. Semiconductor metal oxides such as IGZO (indium gallium zinc oxide) may provide greater channel carrier mobility, for example, up to 10 $cm^2/(V \cdot s)$, so that TFTs made of IGZO may realize greater on-state current and switching ratio, thus supporting light detection with a higher response speed at a higher frame rate. Thus, the semiconductor metal oxides such as IGZO are more advanced materials for the active layer. In addition, LTPS (Low Temperature Poly-Silicon) is also a material for forming an active layer of a TFT, but it is difficult for LTPS to achieve high uniformity when manufacturing a large-area backplane.

SUMMARY

According to one aspect of the present disclosure, there is provided a light detection substrate including a substrate and a plurality of light detection units arranged on the substrate, each of the plurality of light detection units including a first electrode, a second electrode, and a photoelectric conversion layer, the first electrode and the second electrode being on the substrate, the photoelectric conversion layer being on a side of the first electrode and the second electrode away from the substrate, an orthographic projection of the photoelectric conversion layer on the substrate covering orthographic projections of the first electrode and the second electrode on the substrate, a spacer region existing between the orthographic projections of the first electrode and the second electrode on the substrate, wherein the photoelectric conversion layer is provided with at least one opening, and an orthographic projection of the at least one opening on the substrate is in the spacer region and does not overlap the orthographic projections of the first electrode and the second electrode on the substrate.

In some embodiments, a distance between the orthographic projection of the at least one opening on the substrate and an orthographic projection of a first electrode adjacent to the at least one opening on the substrate is greater than or equal to 2 μm, and a distance between an orthographic projection of the at least one opening on the substrate and the orthographic projection of a second electrode adjacent to the at least one opening on the substrate is greater than or equal to 2 μm.

In some embodiments, each of the first electrode and the second electrode has a thickness of less than or equal to 2000 angstroms in a direction perpendicular to the substrate.

In some embodiments, the first electrode and the second electrode each have a thickness of 500 angstroms.

In some embodiments, the first electrode and the second electrode each have a slope angle of more than 0° and less than 90°.

In some embodiments, the plurality of light detection units are arranged in an array, the second electrodes in the plurality of light detection units have a one-piece structure, the second electrodes having a one-piece structure include at least one first electrode line along a first direction and at least one second electrode line along a second direction, the at least one first electrode line and the at least one second electrode line intersect to form a plurality of light detection unit regions arranged in an array, each of the plurality of light detection unit regions is provided with one first electrode of the plurality of first electrodes, the first electrode includes a first connection structure extending along the second direction and at least one first finger structure protruding from the first connection structure along the first direction; the second electrodes having a one-piece structure include at least one second finger structure protruding from the second electrode line along the first direction in each of the plurality of light detection unit regions; and a protruding direction of the at least one first finger structure is opposite to a protruding direction of the at least one second finger structure, and an orthographic projection of the at least one second finger structure on the substrate is located between orthographic projections of the at least one first finger structure on the substrate in a same light detection unit region, and is not overlapped with an orthographic projection of the at least one first finger structure on the substrate.

In some embodiments, the first electrode is in an "E" shape.

In some embodiments, the at least one opening includes a first opening located between one side of the "E" shaped first electrode away from the first finger structure thereof and an adjacent second electrode line.

In some embodiments, the at least one opening further includes a second opening located between the "E" shaped first electrode and an adjacent one of the first electrode lines.

In some embodiments, the first opening is strip-shaped and extends along the second direction, the second opening is strip-shaped and extends along the first direction, a projection length of the first opening along the second direction is greater than or equal to a projection length of the first electrode along the second direction, and a projection length of the second opening along the first direction is greater than or equal to a projection length of the first electrode along the first direction.

In some embodiments, the first opening and the second opening intersect with each other to form an opening in an "L" shape.

In some embodiments, the first electrode and the second electrode are made of the same material and are disposed in the same layer, each of the plurality of light detection units further includes an insulating layer between the photoelectric conversion layer and the first electrodes and the second electrodes; the at least one opening extends through the insulating layer.

In some embodiments, the insulating layer includes an inorganic insulating layer having a thickness ranging from 100 to 500 angstroms.

In some embodiments, the insulating layer includes an organic insulating layer having a thickness ranging from 1000 to 2000 angstroms.

In some embodiments, each of the plurality of light detection units further includes an electrical signal output circuit disposed on a side of the first electrodes and the second electrodes close to the substrate, a planarization layer is between the electrical signal output circuit and the first electrodes and the second electrodes, and the electrical signal output circuit is connected to the first electrode through a via hole in the planarization layer.

In some embodiments, the electrical signal output circuit includes a switching transistor; the switching transistor includes a first pole connected to the first electrode, a second pole connected to an output terminal, and a gate connected to a driving signal input terminal.

In some embodiments, the electric signal output circuit includes a reset transistor, a capacitor, an amplifying transistor, and a switching transistor, a second pole of the reset transistor, a first pole of the capacitor and a gate of the amplifying transistor are connected to the first electrode, respectively; a first pole of the amplifying transistor is connected to a driving current input terminal, and a second pole of the amplifying transistor is connected to a first pole of the switching transistor; a first pole of the reset transistor is connected to a reset signal terminal, and a gate of the reset transistor is connected to a driving signal input terminal; and a second pole of the switching transistor is connected to an output terminal, and a gate of the switching transistor is connected to the driving signal input terminal.

In some embodiments, the photoelectric conversion layer is made of a hydrogenated amorphous silicon material, and an active layer of a transistor in the electric signal output circuit is made of a semiconductor metal oxide material.

According to another aspect of the present disclosure, there is provided a light detection apparatus, including the light detection substrate described above and a driving circuit for driving the light detection substrate.

According to another aspect of the present disclosure, there is provided a manufacturing method for the light detection substrate described above, including: forming a plurality of light detection units on a substrate, wherein the forming the plurality of light detection units includes forming first electrodes, second electrodes, and a photoelectric conversion layer on the substrate, and forming at least one opening in the photoelectric conversion layer, such that: each of the plurality of light detection units includes a first electrode of the first electrodes, a second electrode of the second electrodes and the photoelectric conversion layer, the first electrode and the second electrode are on the substrate, the photoelectric conversion layer is on a side of the first electrode and the second electrode away from the substrate, an orthographic projection of the photoelectric conversion layer on the substrate covers orthographic projections of the first electrode and the second electrode on the substrate, a spacer region exists between the orthographic projections of the first electrode and the second electrode on the substrate, and an orthographic projection of the at least one opening in the photoelectric conversion layer on the substrate is in the spacer region and does not overlap the orthographic projections of the first electrode and the second electrode on the substrate.

DETAIL DESCRIPTION OF EMBODIMENTS

In order to enable one of ordinary skill in the art to better understand the technical solution of the present disclosure, a light detection substrate, a manufacturing method thereof, and a light detection apparatus of the present disclosure are further described in detail below with reference to accompanying drawings and embodiments.

Metal-Semiconductor-Metal (MSM) light detection structure has advantages of high response speed, small capacitance, simple process, easy integration and the like, and is widely applied to the field of semiconductor detection, and particularly may be integrated with various TFT backplanes, forming an X-ray flat panel detector. A semiconductor in an MSM light detector is usually hydrogenated amorphous silicon a-Si:H. An active layer of a TFT for outputting an electrical signal in a TFT backplane is generally made of a semiconductor metal oxide, such as IGZO. The active layer made of the IGZO has a problem in stability, which is easily deteriorated due to H ions.

Due to the a-Si:H (hydrogenated amorphous silicon) layer in the MSM light detector, when integrated with the TFT backplane, the characteristics of TFT are susceptible to an a-Si:H deposition process (during which H ions are rich in a chamber during a plasma enhanced chemical vapor deposition process) and diffusion of H ions in the a-Si:H layer covering the TFT backplane, and therefore, a threshold voltage Vth drift occurs. The reason is that when the a-Si:H layer in the MSM light detector is integrated with the TFT backplane having the active layer made of IGZO, the characteristics of TFT are easily influenced by H ions in the a-Si:H layer, so that an IGZO channel is injected with the H ions. The H ions serve as donor ions to make the channel conductive, thereby causing the TFT threshold voltage Vth to negatively drift. Therefore, a glass substrate with the deposited a-Si:H layer needs to be annealed, so that H ions in the film layer can be released, the Vth drift can be relieved, and the normal characteristics of the TFT can be achieved.

However, in the MSM light detection structure, the a-Si:H layer is generally designed as a whole, and due to the excessively large coverage, even if annealing is performed for a long time, the H ions inside the film layer of the MSM light detection substrate are released incompletely. As a result, the threshold voltage of the TFT corresponding to an edge of the MSM light detection substrate may be recovered, but the characteristics of the TFT corresponding to a center of the MSM light detection substrate are still abnormal. Meanwhile, when the outermost surface of the MSM light detection substrate is covered by the whole a-Si:H layer, because water vapor and other gases absorbed in the film layer may be released during annealing, the whole a-Si:H layer may block gas release, so that vapor pressure inside the film layer is too high, resulting in the film layer peeling.

Based on the two problems, the related technical scheme is: patterning and etching the deposited a-Si:H layer to form periodic openings, and then performing the annealing. The patterned openings have an advantage that the periodic openings may be used as air release passages, which may facilitate the release of both water vapor and H ions, so that the problem of peeling of the a-Si:H layer is solved, and the characteristics of TFT at any position of the MSM light detection substrate may be recovered by annealing.

Figure 1:
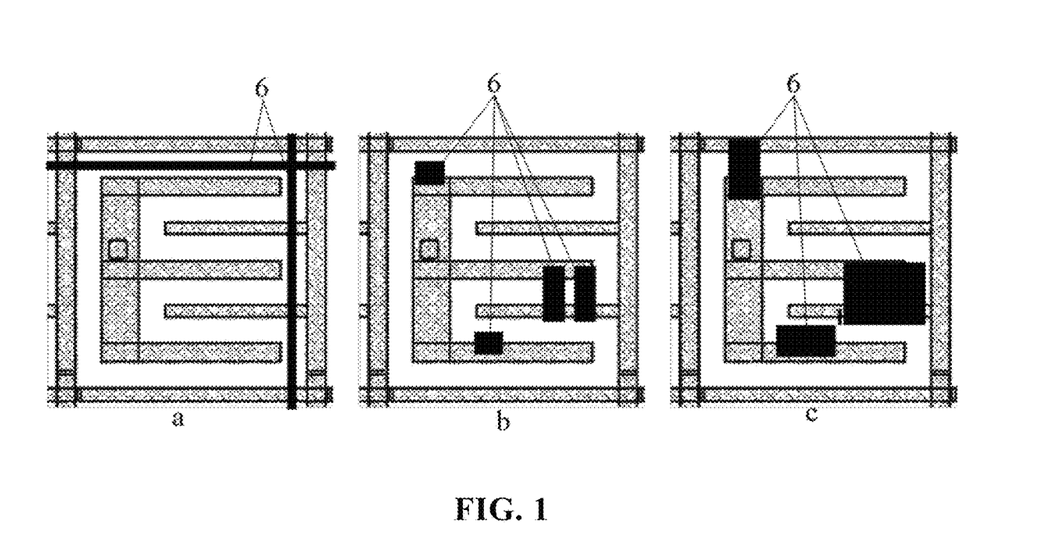
FIG. 1 is a schematic diagram of a structure with openings formed in an a-Si:H layer of an MSM light detection substrate in the related art.
Figure 2:
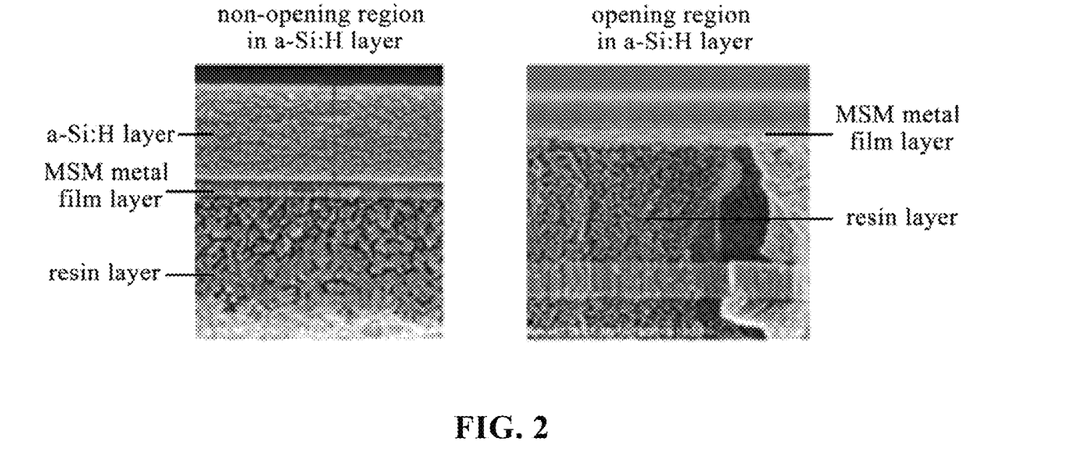
FIG. 2 is a cross-sectional view of an opening region (a region formed with openings) and a non-opening region (a region without openings) in an a-Si:H layer of an MSM light detection substrate in the related art.

In the related art, there are three patterned design schemes for openings in the a-Si:H layer in an APS (active pixel sensor) type MSM light detection substrate, as shown in FIG. 1, which respectively include: a. openings 6 are formed in the periphery of each of pixels arranged in an array in the MSM light detection substrate; b. openings 6 are formed directly above a channel of a TFT active layer in the MSM light detection substrate; and c. openings 6 are formed above the whole active layer of the TFT in the MSM light detection substrate. However, the above three types of design schemes for openings have a problem that the opening of the a-Si:H layer and the MSM metal film layer thereunder are overlapped in a direction perpendicular to the MSM light detection substrate, which results in that the MSM metal film layer is etched or even over-etched while patterning and etching the a-Si:H layer, i.e. the MSM metal film layer is etched and thinned or even eliminated while patterning and etching the a-Si:H layer (as shown in FIG. 2). The subsequent annealing process may oxidize the exposed MSM metal electrode in the opening, thus causing the damage to the MSM photoelectric characteristics, which is not beneficial to photocurrent conduction in MSM. The reason why the MSM photoelectric characteristics are damaged due to the fact that the MSM metal electrode is etched and thinned and the exposed portion of the MSM metal electrode at the opening is oxidized is that: when the electrode is used as a wire for current transmission, the photocurrent is very sensitive to a resistance of the electrode. Generally, a resistance is inversely proportional to a thickness, the resistance of the metal electrode may be greatly increased due to the thinning and surface oxidation, which is not beneficial to photocurrent conduction, resulting in impaired MSM photoelectric characteristics.

Figure 3:
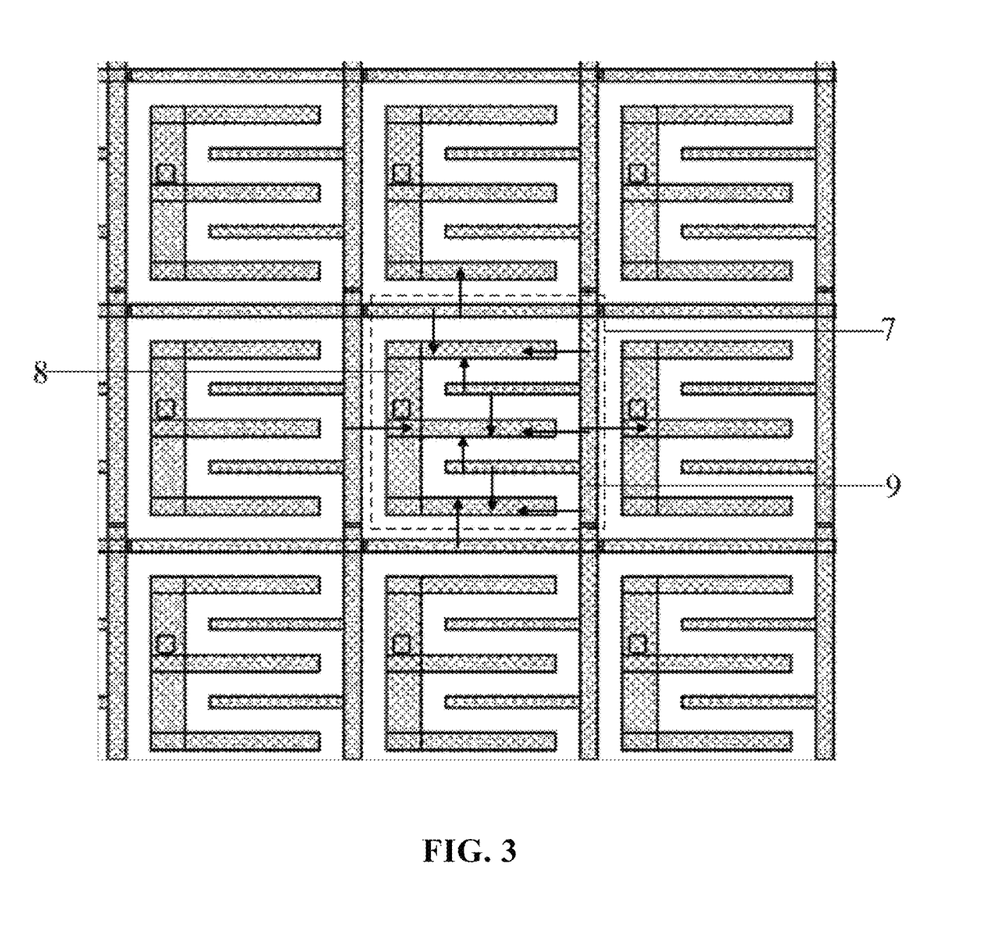
FIG. 3 is a schematic diagram illustrating a current transmission between a HV electrode and a sense electrode when an a-Si:H layer covers an entire surface of an MSM light detection substrate in the related art.

In addition, in a current conventional design of an X-ray MSM light detection substrate, the design of the MSM metal electrode and the whole surface of the MSM metal electrode being entirely covered by an upper a-Si:H layer easily leads to crosstalk of photocurrent signals generated between adjacent pixels 7 in the MSM light detection substrate. As shown in FIG. 3, a middle E-shape electrode is a sense electrode 8 (i.e., a low potential electrode that is ultimately connected to an ROIC (Readout Integrated Circuit)), and the other electrodes surrounding the middle E-shape electrode are HV electrodes 9 (i.e., high potential electrodes to which a constant high voltage signal is applied). When the a-Si:H layer is provided on the whole surface of the metal, during light detection, current may be conducted from HV electrodes 9 to sense electrodes 8 through a plurality of paths (e.g., all arrows in FIG. 3), which includes not only the current transmission between HV electrodes 9 and sense electrodes 8 within the pixel 7, but also the current transmission between HV electrodes 9 and sense electrodes 8 in different pixels 7. The current between the pixels 7 causes signal crosstalk.

Figure 4:
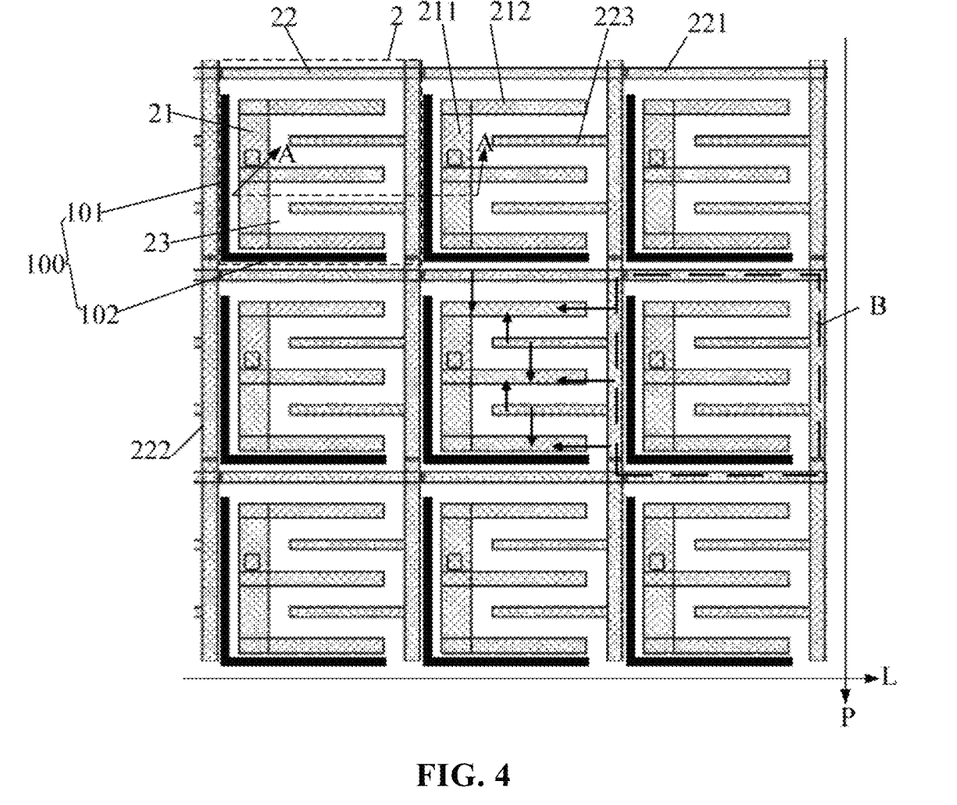
FIG. 4 is a schematic top view of a light detection substrate according to an embodiment of the present disclosure.
Figure 5:
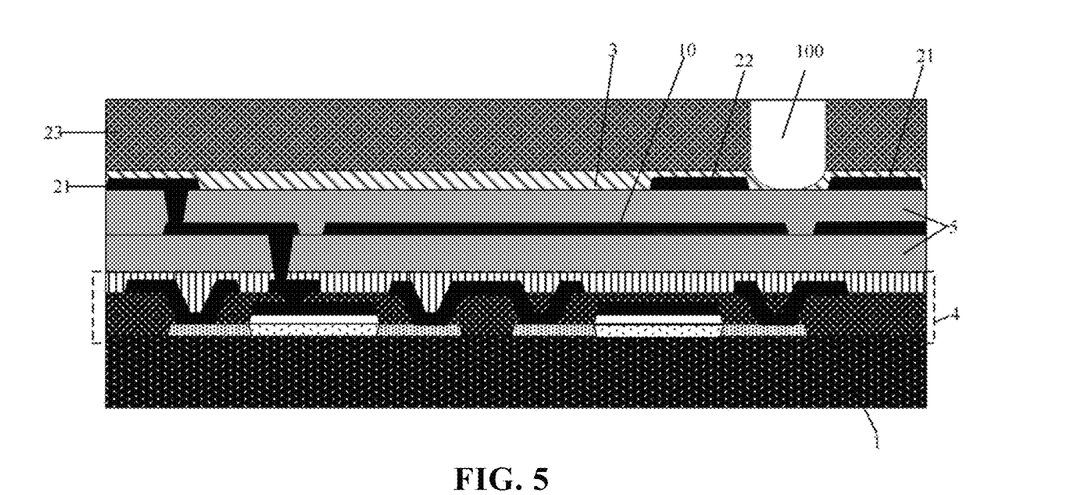
FIG. 5 is a cross-sectional view of a portion of a light detection substrate according to an embodiment of the present disclosure taken along a section line AA in FIG. 4.

To solve the problems of the current MSM light detection substrate, an embodiment according to the present disclosure provides a light detection substrate. As shown in FIGS. 4 and 5, the light detection substrate includes a substrate 1 and a plurality of light detection units 2 disposed on the substrate 1. The plurality of light detection units 2 are arranged in an array. Each of the plurality of light detection units 2 includes a first electrode 21, a second electrode 22, and a photoelectric conversion layer 23. The first electrode 21 and the second electrode 22 are located on the substrate 1. The photoelectric conversion layer 23 is located on a side of the first electrode 21 and the second electrode 22 away from the substrate 1. An orthographic projection of the photoelectric conversion layer 23 on the substrate 1 covers orthographic projections of the first electrode 21 and the second electrode 22 on the substrate 1. A spacer region exists between orthographic projections of the first electrode 21 and the second electrode 22 on the substrate 1. The photoelectric conversion layer 23 is provided with at least one opening 100, and an orthographic projection of the at least one opening 100 on the substrate 1 is located in the spacer region and does not overlap with orthographic projections of the first electrode 21 and the second electrode 22 on the substrate 1.

The photoelectric conversion layer 23 is made of a hydrogenated amorphous silicon material (a-Si:H). A TFT is integrated in the light detection substrate, and a TFT is integrated in each light detection unit 2, and the TFT is used to output a current obtained by photoelectric conversion. An active layer of the TFT is made of a semiconductor metal oxide material, such as IGZO (indium gallium zinc oxide), and the current output characteristics of TFT having the active layer of such material are better.

The orthographic projection of each of the at least one opening 100 on the substrate 1 is located in the spacer region, that is, the opening 100 is provided in a region of the photoelectric conversion layer 23 non-overlapped (that is, not overlapped) with the first electrode 21 and the second electrode 22, such that when the opening 100 in the photoelectric conversion layer 23 is formed by etching, the first electrode 21 and the second electrode 22 below the photoelectric conversion layer 23 may be prevented from being etched and thinned, thereby solving the problem in the related art that the first electrode 21 and/or the second electrode 22 exposed at the opening 100 are oxidized in the subsequent annealing process, so as to ensure that the photoelectric characteristics of the light detection substrate are not damaged.

In addition, by forming the openings 100 in the photoelectric conversion layer 23, the release of H ions in the photoelectric conversion layer 23 may be facilitated in the subsequent annealing process of the light detection substrate, so as to avoid the influence of H ion diffusion on the characteristics of TFT in the light detection substrate. Moreover, since the openings 100 are formed in the photoelectric conversion layer 23 of each light detection unit 2, it is further ensured that the characteristics of TFT at any position in the light detection substrate may be normal after the subsequent annealing process. Meanwhile, the openings 100 formed in the photoelectric conversion layer 23 may also facilitate the release of water vapor and other gases in the annealing process, thereby preventing the photoelectric conversion layer 23 from being peeled off in the annealing process.

Optionally, in the present embodiment, a distance between an orthographic projection of the opening 100 on the substrate 1 and an orthographic projection of the first electrode 21 on the substrate 1 is greater than or equal to 2 μm, and a distance between an orthographic projection of the opening 100 on the substrate 1 and an orthographic projection of the second electrode 22 on the substrate 1 is greater than or equal to 2 μm. With such an arrangement, it may be further ensured that the opening 100 in the photoelectric conversion layer 23 does not overlap with each of the first electrode 21 and the second electrode 22 in the direction perpendicular to the substrate 1, so as to further ensure that during the patterning process and the etching process of the photoelectric conversion layer 23, the first electrode 21 and the second electrode 22 are not etched, to further ensure that the photoelectric characteristics of the light detection substrate are not damaged.

Optionally, a thickness of each of the first electrode 21 and the second electrode 22 is less than or equal to 2000 angstroms. In the present embodiment, for example, the thickness of each of the first electrode 21 and the second electrode 22 may be 500 angstroms. The first electrode 21 and the second electrode 22 are made of a metal conductive material such as molybdenum. In the related art, the opening in the a-Si:H layer and a pattern of the MSM metal film layer below the opening partially overlap in the direction perpendicular to the substrate 1, so that the MSM metal may be over-etched in the etching process of the a-Si:H layer. Therefore, the thickness of the MSM metal film layer is required to be more than 2000 angstroms to maintain the light detection sensitivity of the MSM light detector. In the present embodiment, the opening 100 in the photoelectric conversion layer 23 is located in the spacer region between the first electrode 21 and the second electrode 22, therefore the opening 100 does not overlap with the first electrode 21 and the second electrode 22, so that the first electrode 21 and the second electrode 22 are not etched, and the first electrode 21 and the second electrode 22 are not necessarily made of a metal film with a greater thickness. In the light detection substrate, the first electrode 21 and the second electrode 22 are disposed in the same layer, and the applied electric field is a transverse electric field, so that the resistance between the two electrodes is inversely proportional to the thickness of the metal film layer. Reducing the thickness of the metal film layer of the electrodes is equivalent to increasing the resistance between the two electrodes, which is beneficial to reducing the dark state current of the light detection substrate and further reducing the dark noise, which is very helpful for low-dose light detection.

In the present embodiment, a slope angle of each of the first electrode 21 and the second electrode 22 is greater than 0° and less than 90°. The slope angle is an included angle between a side wall of each of the first electrode 21 and the second electrode 22 and a plane where the substrate 1 is located, and the first electrode 21 or the second electrode 22 is provided in a range of the included angle. In the related art, a cross-sectional shape of the MSM metal electrode in a thickness direction thereof (i.e., the direction perpendicular to the substrate 1) is an inverted trapezoid, i.e., the slope angle of the MSM metal electrode is generally greater than 90°. The MSM metal electrode has a wide upper surface, a narrow lower surface and a sharp edge of the upper surface, which is easy to leak electricity and generate larger dark current under the condition of applying a high voltage to the MSM metal electrode. In the present embodiment, the slope angles of the first electrode 21 and the second electrode 22 are set, so that the cross-sectional shape of each of the first electrode 21 and the second electrode 22 along the thickness direction thereof is a regular trapezoid, and the sharpness of the edges of the upper surfaces of the electrodes is reduced, thereby reducing the dark current.

Optionally, in the present embodiment, as shown in FIG. 4, the plurality of light detection units 2 are arranged in an array. The second electrodes 22 in the plurality of light detection units 2 are integrally formed (have a one-piece structure). The integrally formed second electrode 22 includes at least one first electrode line 221 along a first direction L and at least one second electrode line 222 along a second direction P. The first electrode lines 221 and the second electrode lines intersect to form a plurality of light detection unit regions B arranged in an array, and one light detection unit region B corresponds to one light detection unit 2. One first electrode 21 is disposed in each of the plurality of light detection unit regions B. The first electrode 21 includes a first connection structure 211 extending along the second direction P and at least one first finger structure 212 protruding from the first connection structure 211 along the first direction L. The integrally formed second electrode 22 is provided with at least one second finger structure 223 extending from the second electrode line 222 along the first direction L in each of the plurality of light detection unit regions B. A protruding direction of the at least one first finger structure 212 is opposite to the extending direction of the at least one second finger structure 223. An orthographic projection of the at least one first finger structure 212 on the substrate 1 is located between orthographic projections of the at least one second finger structure 223 on the substrate 1 in a same light detection unit region B, and is not overlapped with the orthographic projection of each of the at least one second finger structure 223 on the substrate 1. That is, in one light detection unit region B, at least one first finger structure 212 and at least one second finger structure 223 form an "interdigitated electrode".

Optionally, the first electrode is in an "E" shape, and the first electrodes in the "E" shape in the plurality of light detection unit regions have a same orientation. As shown in FIG. 4, orientations of the E-shaped first electrodes in the plurality of light detection unit regions are the same.

Optionally, the opening 100 includes a first opening 101 and a second opening 102. The first opening 101 is located between two adjacent light detection units 2 along the first direction L of the array, specifically, between one side of the "E" shaped first electrode away from its first finger structure and the second electrode line 222 adjacent to the "E" shaped first electrode. The second opening 102 is located between two adjacent light detection units 2 along the second direction P of the array, specifically, between the "E" shaped first electrode and one of the first electrode lines 221 adjacent to the "E" shaped first electrode. The first direction L is a row direction, and the second direction P is a column direction. Of course, the first direction may be a column direction, and the second direction may be a row direction.

The first opening 101 is strip-shaped and extends along the second direction, and the second opening 102 is strip-shaped and extends along the first direction. The first opening 101 and the second opening 102 may extend and intersect with each other to form an "L" shaped opening having a one-piece structure, or may be separated from each other to form two independent openings. The current converted by the photoelectric conversion layer 23 may be conducted between the first electrodes 21 and the second electrodes 22 through a plurality of paths when the photoelectric conversion layer 23 does not have the first openings 101 and the second openings 102, which includes not only the current transmission between the first electrode 21 and the second electrode 22 within the light detection unit 2, but also the current transmission between the first electrodes 21 and the second electrodes 22 of the adjacent light detection units 2. By providing the first opening 101 between the adjacent light detection units 2 along the first direction L and providing the second opening 102 between the adjacent light detection units 2 along the second direction P, since at least a portion of the photoelectric conversion layer 23 in the current transmission path between the adjacent light detection units 2 is etched away, the current transmission path between the adjacent light detection units 2 is at least partially cut off, so that the current transmission between the adjacent light detection units 2 is reduced, thereby suppressing the signal crosstalk between the adjacent light detection units 2 and improving the light detection effect of the light detection substrate.

Further, optionally, in the present embodiment, since the second electrode is formed by intersecting at least one first electrode line and at least one second electrode line, and the first electrode is located in a light detection unit region formed by intersecting at least one first electrode line and at least one second electrode line, a length of a projection (projection length) of the first electrode 21 along the second direction P of the array is smaller than a length of a projection (projection length) of the second electrode 22 along the second direction P of the array; a width of a projection (projection width) of the first electrode 21 along the first direction L of the array is smaller than a width of a projection (projection width) of the second electrode 22 along the first direction L of the array. The first openings 101 are strip-shaped, and a length direction of the first openings 101 is along the second direction P of the array. The second openings 102 are strip-shaped, and a length direction of the second openings 102 is along the first direction L of the array. A length of the first opening 101 is greater than or equal to the projection length of the first electrode 21 along the second direction P of the array, and an orthographic projection of the first opening 101 along the second direction P of the array does not overlap with an orthographic projection of the first electrode 21 along the second direction P of the array. A length of the second opening 102 is greater than or equal to the projection width of the first electrode 21 along the first direction L of the array, and an orthographic projection of the second opening 102 along the first direction L of the array does not overlap with an orthographic projection of the first electrode 21 along the first direction L of the array. With such an arrangement, the first opening 101 may completely cut off the current transmission path between the adjacent light detection units 2 along the first direction L of the array, and the second opening 102 may completely cut off the current transmission path between the adjacent light detection units 2 along the second direction P of the array, so as to greatly reduce the current transmission between the adjacent light detection units 2, thereby further suppressing the signal crosstalk between the adjacent light detection units 2, and improving the light detection effect of the light detection substrate.

In the present embodiment, the first opening 101 and the second opening 102 are intersected with each other to form an opening in an "L" shape, which may thoroughly suppress the signal crosstalk between the adjacent light detection units 2, and improve the light detection effect of the light detection substrate.

Optionally, the first electrode 21 and the second electrode 22 are made of the same material and are disposed in the same layer. The light detection unit 2 further includes an insulating layer 3, the insulating layer 3 is located between the photoelectric conversion layer 23 and the first and second electrodes 21 and 22; and the opening 100 penetrates the insulating layer 3. The insulating layer 3 may be an inorganic insulating layer, and a thickness of the inorganic insulating layer is in a range of 100 to 500 angstroms. The inorganic insulating layer is made of silicon nitride or silicon oxide. The insulating layer 3 may function as an insulating layer when no light irradiates on the light detection substrate, to block the current transmission between the first electrode 21 and the second electrode 22 when no light irradiates thereon, and then functions to reduce the dark current in the light detection substrate, and reduce the noise. When light irradiates on the light detection substrate, the insulating layer 3 is thin, which is basically equivalent to be conductive, and does not affect the current transmission between the first electrode 21 and the second electrode 22.

Optionally, a cross-sectional shape of the opening 100 in a plane perpendicular to the substrate 1 is rectangular, or a bottom side of the cross-sectional shape is a semicircular arc.

It should be noted that the insulating layer 3 may be an organic insulating layer, and a thickness of the organic insulating layer is in a range of 1000 to 2000 angstroms. A thickness of the photoelectric conversion layer 23 is in a range of 4000 to 8000 angstroms.

Optionally, the light detection unit 2 further includes an electrical signal output circuit 4, and the electrical signal output circuit 4 is disposed on a side of the first electrode 21 and the second electrode 22 close to the substrate 1. A planarization layer 5 is further provided between the electric signal output circuit 4 and the first electrode 21 and the second electrode 22. The electric signal output circuit 4 is connected to the first electrode 21 through a via hole in the planarization layer 5. The electric signal output circuit 4 is configured to output the current signal converted by the photoelectric conversion layer 23, for example, to an imaging apparatus for imaging of the light detection information. The planarization layer 5 is made of resin materials, and the resin materials may be made thicker, so that the planarization layer 5 may enable a surface of the substrate 1 formed with the electric signal output circuit 4 to be flat, which is beneficial to make the light detection effect of the light detection substrate better.

In addition, a light shielding metal layer 10 is further disposed above the electrical signal output circuit 4, and the light shielding metal layer 10 is used for shielding light irradiated from the light detection unit 2 to the electrical signal output circuit 4. Since the electric signal output circuit 4 includes a transistor circuit, the light shielding metal layer 10 may prevent the transistor from changing electric properties under light irradiation, such as increased leakage current, which ensures normal characteristics of the transistor.

Figure 6:
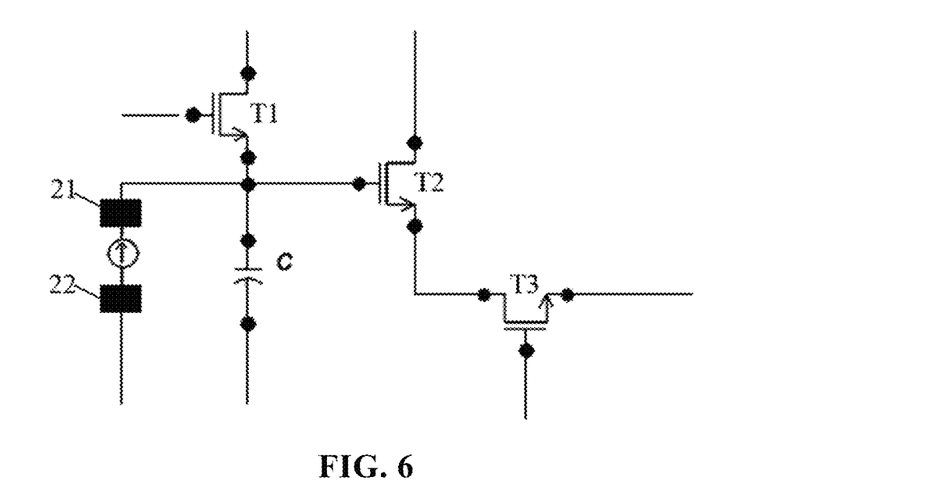
FIG. 6 is a circuit diagram of an electrical signal output circuit according to an embodiment of the present disclosure.

In the present embodiment, as shown in FIG. 6, the electric signal output circuit 4 includes a reset transistor T1, a capacitor C, an amplifying transistor T2, and a switching transistor T3. The first electrode 21 is connected to a second pole of the reset transistor T1, a first pole of the capacitor C, and a gate of the amplifying transistor T2. A second pole of the amplifying transistor T2 is connected to a first pole of the switching transistor T3, and a first pole of the amplifying transistor T2 is connected to a driving current input terminal. A gate of the reset transistor T1 is connected to a driving signal input terminal, and a first electrode of the reset transistor T1 is connected to a reset signal terminal. The first pole of the amplifying transistor T2 is connected to the driving current input terminal, to output an amplified current signal to the second pole thereof connected to the first pole of the switching transistor T3. A gate of the switching transistor T3 is connected to the driving signal input terminal, and a second pole of the switching transistor T3 is connected to an output terminal to output the amplified current signal. A second pole of the capacitor may be connected to other structures of the circuit to store the photocurrent. That is, the light detection substrate in the present embodiment is an APS (active pixel sensor) type.

Figure 7:
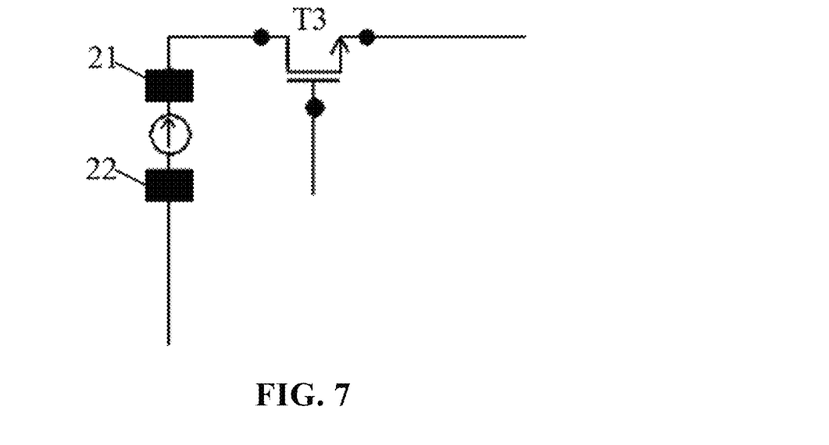
FIG. 7 is a circuit diagram of an electrical signal output circuit according to an embodiment of the present disclosure.
Figure 8:
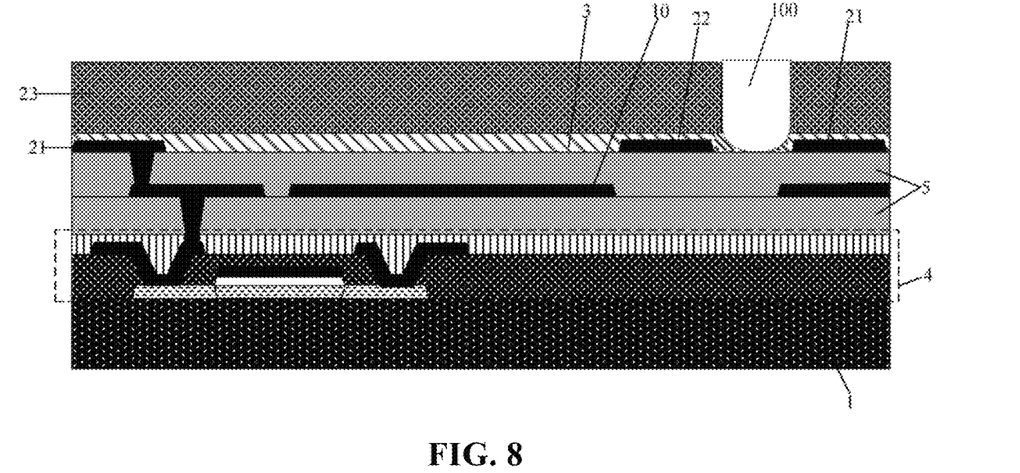
FIG. 8 is a cross-sectional view of a portion of a light detection substrate according to an embodiment of the present disclosure taken along a section line AA in FIG. 4.

Optionally, in some embodiments, as shown in FIGS. 7 and 8, the electrical signal output circuit 4 may also include only the switching transistor T3, and the first electrode 21 is connected to a first pole of the switching transistor T3. A gate of the switching transistor T3 is connected to a driving signal input terminal, and a second pole of the switching transistor T3 is connected to an output terminal to output the current signal converted by the photoelectric conversion layer 23. That is, the light detection substrate may be a PPS (passive pixel sensor) type.

Based on the above structure of the light detection substrate, an embodiment according to the present disclosure further provides a manufacturing method for a light detection substrate, including: forming a plurality of light detection units on a substrate; the forming a plurality of light detection units including forming first electrodes, second electrodes, a photoelectric conversion layer on the substrate, and forming at least one opening in the photoelectric conversion layer, so that the light detection substrate has the structure in the above-described embodiments.

When the photoelectric conversion layer is formed, exposure is carried out by adopting an exposure process, and then a reactive ion etching process is carried out. The exposure process includes steps of coating, exposing, developing, etc. of a photoresist, and the opening in the present disclosure may be formed by only changing an exposure mask for the photoelectric conversion layer. In addition, the openings of the present disclosure may also be formed by changing the exposure procedure. Since they are conventional processes, they are not described in detail herein.

Figure 9:
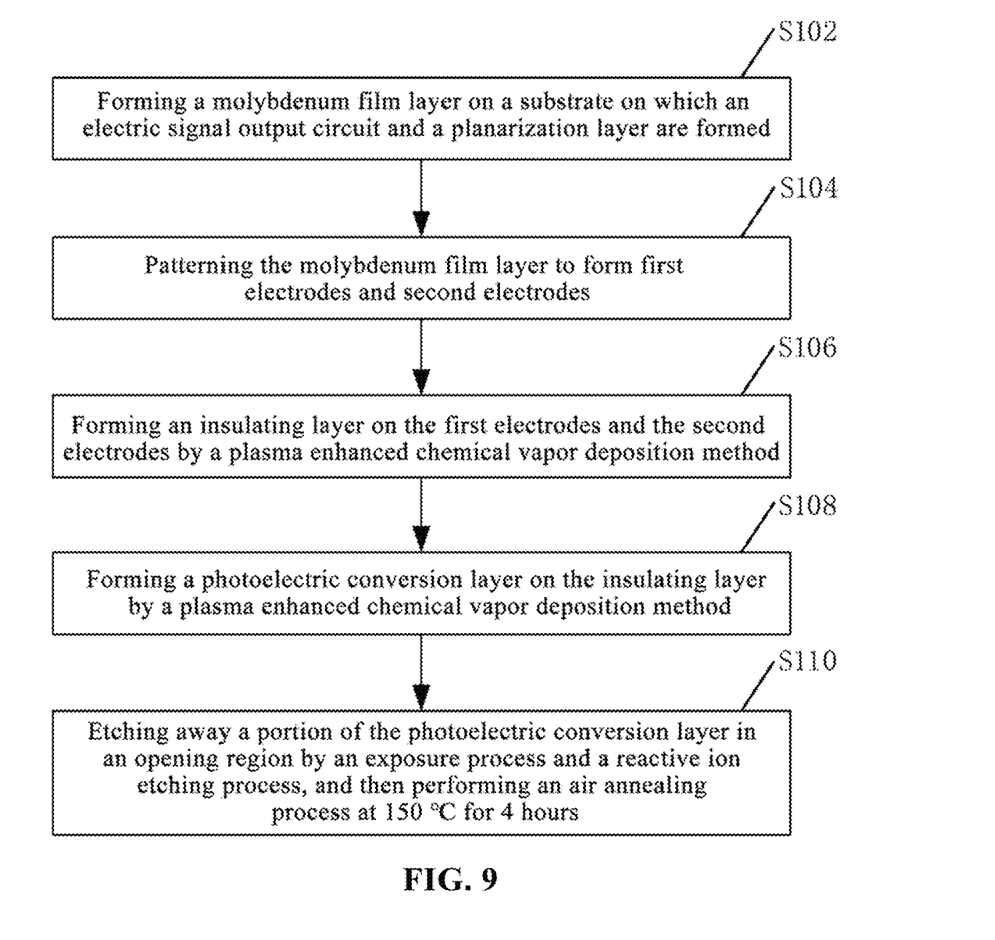
FIG. 9 is a flowchart of a manufacturing method for a light detection substrate according to an embodiment of the present disclosure.

In the present embodiment, a specific process for manufacturing the light detection substrate is shown in FIG. 9.

Step S102, forming a molybdenum film layer on a substrate on which an electric signal output circuit and a planarization layer are formed. A thickness of the molybdenum film layer may be 500 angstroms.

Step S104, patterning the molybdenum film layer to form first electrodes and second electrodes.

Step S106, forming an insulating layer on the first electrodes and the second electrodes by a plasma enhanced chemical vapor deposition method. A thickness of the insulating layer may be 200 angstroms.

Step S108, forming a photoelectric conversion layer on the insulating layer by a plasma enhanced chemical vapor deposition method. A thickness of the photoelectric conversion layer may be 5000 angstroms.

Step S110, etching away a portion of the photoelectric conversion layer in an opening region by an exposure process and a reactive ion etching (RIE) process, and then performing an air annealing at 150° C. for 4 hours.

Both the electrical signal output circuit and the planarization layer are formed on the substrate by conventional processes, which are not described herein.

In the light detection substrate provided in the embodiments according to the present disclosure, the orthographic projection of the opening on the substrate is located in the spacer region, that is, the opening is formed in the a region of the photoelectric conversion layer non-overlapped with the first electrode and the second electrode, such that when the pattern of the photoelectric conversion layer and the opening is formed through etching, the first electrode and the second electrode below the photoelectric conversion layer may be prevented from being etched and thinned, thereby solving the problem in the related art that the first electrode and/or the second electrode exposed at the opening are oxidized in a subsequent annealing process, so as to ensure that the photoelectric characteristics of the light detection substrate are not damaged. In addition, by forming the openings in the photoelectric conversion layer, the release of H ions in the photoelectric conversion layer may be facilitated in the subsequent annealing process of the light detection substrate, so as to avoid the influence of H ion diffusion on the characteristics of TFT in the light detection substrate. Moreover, since the openings are formed in the photoelectric conversion layer of each light detection unit, it is further ensured that the characteristics of TFT at any position in the light detection substrate may be normal after the subsequent annealing process. Meanwhile, the openings formed in the photoelectric conversion layer may also facilitate the release of water vapor and other gases in the annealing process, thereby preventing the photoelectric conversion layer from being peeled off in the annealing process.

An embodiment according to the present disclosure further provides a light detection apparatus, which includes the light detection substrate in the above embodiments and a driving circuit for driving the light detection substrate.

By adopting the light detection substrate in the above-mentioned embodiments, the photoelectric characteristics of the light detection apparatus are improved, while it is ensured that all the characteristics of the integrated TFTs in this light detection apparatus are normal.

It will be understood that the above embodiments are merely exemplary embodiments employed to illustrate the principles of the present disclosure, and the present disclosure is not limited thereto. It will be apparent to one of ordinary skill in the art that various changes and modifications may be made without departing from the scope of the disclosure as defined in the following claims, and such changes and modifications are to be considered within the scope of the disclosure.

What is claimed is:

1. A light detection substrate, comprising a substrate and a plurality of light detection units arranged on the substrate, each of the plurality of light detection units comprising a first electrode, a second electrode, and a photoelectric conversion layer, the first electrode and the second electrode being on the substrate, the photoelectric conversion layer being on a side of the first electrode and the second electrode away from the substrate, an orthographic projection of the photoelectric conversion layer on the substrate covering orthographic projections of the first electrode and the second electrode on the substrate, a spacer region existing between the orthographic projections of the first electrode and the second electrode on the substrate, wherein the photoelectric conversion layer is provided with at least one opening, and an orthographic projection of the at least one opening on the substrate is in the spacer region and does not overlap the orthographic projections of the first electrode and the second electrode on the substrate, wherein a distance between the orthographic projection of the at least one opening on the substrate and an orthographic projection of a first electrode adjacent to the at least one opening on the substrate is greater than or equal to 2 μm, and a distance between the orthographic projection of the at least one opening on the substrate and an orthographic projection of a second electrode adjacent to the at least one opening on the substrate is greater than or equal to 2 μm.

2. The light detection substrate according to claim 1, wherein each of the first electrode and the second electrode has a thickness of less than or equal to 2000 angstroms in a direction perpendicular to the substrate.

3. The light detection substrate according to claim 2, wherein the first electrode and the second electrode each have a thickness of 500 angstroms.

4. The light detection substrate according to claim 1, wherein the first electrode and the second electrode each have a slope angle of more than 0° and less than 90°.

5. The light detection substrate according to claim 1, wherein the plurality of light detection units are arranged in an array, the second electrodes in the plurality of light detection units have a one-piece structure, the second electrodes having a one-piece structure comprise at least one first electrode line along a first direction and at least one second electrode line along a second direction, the at least one first electrode line and the at least one second electrode line intersect to form a plurality of light detection unit regions arranged in an array, each of the plurality of light detection unit regions is provided with one first electrode of the plurality of first electrodes, the first electrode comprises a first connection structure extending along the second direction and at least one first finger structure protruding from the first connection structure along the first direction;

the second electrodes having a one-piece structure comprise at least one second finger structure protruding from the second electrode line along the first direction in each of the plurality of light detection unit regions; and a protruding direction of the at least one first finger structure is opposite to a protruding direction of the at least one second finger structure, and an orthographic projection of the at least one second finger structure on the substrate is between orthographic projections of the at least one first finger structure on the substrate in a same light detection unit region, and is not overlapped with an orthographic projection of the at least one first finger structure on the substrate.

6. The light detection substrate according to claim 5, wherein the first electrode is in an "E" shape.

7. The light detection substrate according to claim 6, wherein the at least one opening comprises a first opening between one side of the "E" shaped first electrode away from the first finger structure thereof and an adjacent second electrode line.

8. The light detection substrate according to claim 7, wherein the at least one opening further comprises a second opening between the "E" shaped first electrode and an adjacent one of the first electrode lines.

9. The light detection substrate according to claim 8, wherein
the first opening is strip-shaped and extends along the second direction, the second opening is strip-shaped and extends along the first direction, a projection length of the first opening along the second direction is greater than or equal to a projection length of the first electrode along the second direction, and a projection length of the second opening along the first direction is greater than or equal to a projection length of the first electrode along the first direction.

10. The light detection substrate according to claim 9, wherein the first opening and the second opening intersect with each other to form an opening in an "L" shape.

11. The light detection substrate according to claim 1, wherein the first electrode and the second electrode are made of the same material and are in the same layer, each of the plurality of light detection units further comprises an insulating layer between the photoelectric conversion layer and the first electrodes and the second electrodes;
the at least one opening extends through the insulating layer.

12. The light detection substrate according to claim 11, wherein the insulating layer comprises an inorganic insulating layer having a thickness ranging from 100 to 500 angstroms.

13. The light detection substrate according to claim 11, wherein the insulating layer comprises an organic insulating layer having a thickness ranging from 1000 to 2000 angstroms.

14. The light detection substrate according to claim 1, wherein each of the plurality of light detection units further comprises an electrical signal output circuit on a side of the first electrodes and the second electrodes close to the substrate, a planarization layer is between the electrical signal output circuit and the first electrodes and the second electrodes, and the electrical signal output circuit is connected to the first electrode through a via hole in the planarization layer.

15. The light detection substrate according to claim 14, wherein the electrical signal output circuit comprises a switching transistor;
the switching transistor comprises a first pole connected to the first electrode, a second pole connected to an output terminal, and a gate connected to a driving signal input terminal.

16. The light detection substrate according to claim 14, wherein the electric signal output circuit comprises a reset transistor, a capacitor, an amplifying transistor, and a switching transistor,
a second pole of the reset transistor, a first pole of the capacitor and a gate of the amplifying transistor are connected to the first electrode, respectively;
a first pole of the amplifying transistor is connected to a driving current input terminal, and a second pole of the amplifying transistor is connected to a first pole of the switching transistor;
a first pole of the reset transistor is connected to a reset signal terminal, and a gate of the reset transistor is connected to a driving signal input terminal; and a second pole of the switching transistor is connected to an output terminal, and a gate of the switching transistor is connected to the driving signal input terminal.

17. A light detection substrate according to claim 14, wherein the photoelectric conversion layer is made of a hydrogenated amorphous silicon material, and an active layer of a transistor in the electric signal output circuit is made of a semiconductor metal oxide material.

18. A light detection apparatus comprising the light detection substrate according to claim 1 and a driving circuit for driving the light detection substrate.

19. A method for manufacturing the light detection substrate according to claim 1, comprising: forming a plurality of light detection units on a substrate, wherein the forming the plurality of light detection units comprises forming first electrodes, second electrodes, and a photoelectric conversion layer on the substrate, and forming at least one opening in the photoelectric conversion layer, such that each of the plurality of light detection units comprises a first electrode of the first electrodes, a second electrode of the second electrodes and the photoelectric conversion layer; the first electrode and the second electrode are located on the substrate; the photoelectric conversion layer is on a side of the first electrode and the second electrode away from the substrate; an orthographic projection of the photoelectric conversion layer on the substrate covers orthographic projections of the first electrode and the second electrode on the substrate; a spacer region exists between the orthographic projections of the first electrode and the second electrode on the substrate; and an orthographic projection of the at least one opening in the photoelectric conversion layer on the substrate is in the spacer region and does not overlap the orthographic projections of the first electrode and the second electrode on the substrate.

* * * * *